United States Patent [19]

Bijker et al.

[11] Patent Number: 5,548,831
[45] Date of Patent: Aug. 20, 1996

[54] FM RECEIVER HAVING MULTIPLE IF STAGES

[75] Inventors: Wolter Bijker; Wolfdietrich G. Kasperkovitz; Hendricus C. De Ruyter; Willem A. Sloof, all of Eindhoven, Netherlands

[73] Assignee: U.S. Philips Corporation, New York, N.Y.

[21] Appl. No.: 73,922

[22] Filed: Jun. 8, 1993

[30] Foreign Application Priority Data

Jun. 26, 1992 [EP] European Pat. Off. ............. 92201908

[51] Int. Cl.$^6$ ........................................ H04B 1/16
[52] U.S. Cl. ...................... 455/207; 455/266; 455/314
[58] Field of Search ........................ 455/207, 208, 455/314, 315, 266, 182.3, 192.3, 209

[56] References Cited

U.S. PATENT DOCUMENTS

| | | | |
|---|---|---|---|
| 2,510,906 | 6/1950 | Reid | 455/207 |
| 3,361,976 | 1/1968 | Konian | 455/315 |
| 3,544,899 | 12/1970 | Gusyatinsky et al. | 455/207 |
| 4,476,586 | 10/1984 | Ishida | 455/207 |
| 4,562,472 | 12/1985 | Carlson | 455/315 X |
| 4,580,289 | 4/1986 | Enderby | 455/266 |
| 4,885,801 | 12/1989 | Hansen | 455/307 |
| 4,955,078 | 9/1990 | Chung | 455/314 |
| 5,051,703 | 9/1991 | Idogawa et al. | 455/309 |
| 5,108,334 | 4/1992 | Eschenbach et al. | 455/314 |
| 5,155,862 | 10/1992 | Hansen | 455/266 |
| 5,303,417 | 4/1994 | Laws | 455/314 |

FOREIGN PATENT DOCUMENTS 9013175  11/1990  WIPO.

Primary Examiner—Edward F. Urban
Attorney, Agent, or Firm—Bernard Franzblau

[57] ABSTRACT

An FM receiver includes an RF section, a first mixer stage for converting a desired RF reception signal into a first IF signal having a carrier frequency located on average at a first intermediate frequency, a first IF section for selecting the first IF signal, and a second mixer stage for converting the first IF signal into a second IF signal having a carrier frequency located on average at a second intermediate frequency. The second intermediate frequency is below the first intermediate frequency. A second IF section selects the second IF signal and is coupled to an FM demodulator for demodulating the baseband modulation signal of the desired RF reception signal, followed by a low-pass filter for selecting the baseband modulation signal. In order to enhance the signal processing of the FM receiver and to realize a receiver in a largely integrated form, to provide a substantially fully integrable IF stage which is easily exchangeable with the IF section of substantially all existing FM receivers of the superheterodyne type, and to realize a selectivity considerably greater than that of known IF filters, a third mixer stage is coupled between the second IF section and the FM demodulator for converting the second IF signal to a third IF signal having a carrier frequency located on average at a third intermediate frequency which is above the second intermediate frequency.

24 Claims, 2 Drawing Sheets

FM RECEIVER HAVING MULTIPLE IF STAGES

BACKGROUND OF THE INVENTION

This invention relates to an FM receiver comprising an RF section, a first mixer stage for converting a desired RF reception signal to a first IF signal having a carrier frequency located on average at a first intermediate frequency, a first IF section for selecting the first IF signal, a second mixer stage for converting the first IF signal to a second IF signal having a carrier frequency located on average at a second intermediate frequency, said second intermediate frequency being below the first intermediate frequency, a second IF section for selecting the second IF signal, said second IF section being coupled to an FM demodulator for demodulating the baseband modulation signal of said desired RF reception signal, and followed by a low-pass filter for selecting the baseband modulation signal. The invention also relates to an IF stage for use in such an FM reciever.

An FM receiver of this type is known per se, for example, from the international PCT Patent Application WO 88/08223.

In the known FM receiver the first mixer stage is tunable and is used to convert a desired RF reception signal from an RF FM reception range down in frequency to a fixed first intermediate frequency of 10.7 MHz. The first 10.7 MHz IF signal thus obtained is selected in the first IF section and subsequently converted down in frequency again by means of the second mixer stage to a fixed second intermediate frequency of 700 kHz, resulting in said second IF signal. This second 700 kHz IF signal is demodulated by means of said FM demodulator after filtering.

In the frequency demodulation, signal multiplications and non-linear signal processing operations are performed so that mixing products and notably higher order interference components cannot be avoided. For an effective suppression of such interference components, complex and hence costly filters are required. Such filters impede the integration of the FM receiver.

SUMMARY OF THE INVENTION

It is inter alia, an object of the invention to enhance the signal processing of the known FM receiver and to realise the receiver in a largely integrated form.

It is also an object of the invention to provide a substantially fully integrable IF stage which can be exchanged in a simple manner with the IF circuit of substantially all existing FM receivers of the superheterodyne type and which realises a selectivity which may be considerably greater than that of the known IF filters.

According to the invention, an FM receiver of the type described in the opening paragraph is therefore characterized in that a third mixer stage is arranged between the second IF section and the FM demodulator for converting the second IF signal to a third IF signal having a carrier frequency located on average at a third intermediate frequency, which third intermediate frequency is above the second intermediate frequency.

The invention is based on the recognition that an extra degree of freedom is obtained by means of the third mixer stage, which provides the possibility of choosing the second intermediate frequency to be sufficiently low to realise a largely integrated form of the second IF section at a sufficiently large dynamic range and of choosing the third intermediate frequency to be sufficiently high to cause the higher order interference components occurring during the frequency demodulation to occur sufficiently far from the desired baseband modulation signal so that the suppression of these higher order interference components is possible by means of an easily integrable low-pass filter.

When the measure according to the invention is used, the selectivity is greatly enhanced with respect to the known FM receiver, while maintaining a sufficiently large dynamic range, and the higher order interference effects during the frequency demodulation is considerably reduced, while a large degree of integration is possible.

Such an FM receiver according to the invention is preferably characterized in that the third intermediate frequency is equal to the first intermediate frequency and mutually equal second and third mixing signals are applied to the second and third mixer stages. This provides the possibility of generating the mixing signals for the second and third mixer stages by means of one and the same fixed local oscillator, which leads to a simplification of the FM receiver.

Moreover, in such an FM receiver the second mixer stage, the second IF section and the third mixer stage can be incorporated in and/or implemented as a detachable IF stage which is easily integrable as a component and is exchangeable with an IF filter tuned to said first intermediate frequency of a conventional superheterodyne FM receiver. When such an IF stage is used according to the invention as an IF filter in a conventional superheterodyne FM receiver, the last-mentioned preferred embodiment of an FM receiver according to the invention is obtained.

According to the invention, an IF stage which can be used in an FM receiver of the type described in the opening paragraph is therefore characterized in that it has an IF input terminal for applying the first IF signal thereto, which terminal has successively coupled to it the second mixer stage, the second IF section and the third mixer stage, said third mixer stage being coupled to an IF output terminal of the IF stage, mutually equal second and third mixing signals being applied from a common fixed local oscillator to said second and third mixer stages.

Another preferred embodiment of the FM receiver, and particularly the IF stage according to the invention, in which a reduction of non-linear distortion is obtained with respect to the known FM receiver, is characterized by a phase-splitting device for convening a single-phase signal into a pair of phase-quadrature signals and a resonance amplifier operating as a tunable phase-quadrature IF filter, which resonance amplifier applies in-phase and quadrature components of the second IF signal from in-phase and quadrature outputs to said third mixer stage, said third mixer stage comprising in-phase and quadrature multiplier circuits as well as a superposition stage for converting the in-phase and quadrature components of the second IF signal to in-phase and quadrature components of the third IF signal and for mutually superpositioning the two last-mentioned in-phase and quadrature components for converting the third intermediate frequency signal from phase quadrature to single phase.

When this measure is used, the property is utilized that the resonance amplifier in said use as a phase-quadrature filter has a symmetrical bandpass characteristic and a point-symmetrical phase characteristic around the resonance frequency, even at a very low value of the resonance frequency. Such a resonance amplifier is fully integrable and known per se, for example, from European Patent Application EP 0 420 974.

The resonance amplifier may also be used as a phase-splitting device by commonly applying the output signal of the second mixer stage to the in-phase and quadrature inputs of the resonance amplifier. At a sufficiently high quality factor Q of the resonance amplifier, there will be an accurate phase-quadrature relationship between the in-phase and quadrature output signals of the resonance amplifier.

It is alternatively possible to operate the second mixer stage as a phase-splitting device and to provide it to this end with in-phase and quadrature multiplier circuits, signal inputs of which are coupled in common to an output of the first IF section whose mixing signal inputs are coupled to in-phase and quadrature outputs of a fixed local phase-quadrature oscillator and signal outputs of which are coupled to in-phase and quadrature inputs of the resonance amplifier, said in-phase and quadrature outputs of the fixed local phase-quadrature oscillator being also coupled to respective mixing signal inputs of the in-phase and quadrature multiplier circuits of the third mixer stage.

To enhance the selectivity, the last-mentioned FM receiver according to the invention is preferably characterized in that the second IF section comprises a tunable IF filter having a tuning control input to which the baseband modulation signal of said desired RF reception signal is applied for a dynamic frequency tracking of the tuning of the tunable IF filter by means of the modulation signal.

An IF stage according to the invention, which when used as an IF filter in a conventional superheterodyne FM receiver results in the last-mentioned preferred embodiment of an FM receiver according to the invention and in which instabilities in the tuning control are prevented, is characterized in that the tunable IF filter in the second IF section precedes a further FM demodulator which is arranged in a tuning control loop from the output of the tunable IF filter to the tuning control input, said tuning control loop having an open loop gain which is smaller than one.

A further elaboration of the above-mentioned aspect of the invention is realised in a further preferred embodiment of the last-mentioned FM receiver which is characterized in that the further FM demodulator comprises a limiter circuit which is connected via a fourth mixer stage to a first input and via a filter circuit, followed by a fifth mixer stage, to a second input of a multiplier circuit, mutually equal mixing signals being applied to said fourth and fifth mixer stages for an up-conversion of the frequency of the two input signals of the multiplier circuit. When this measure is used, the higher-order interference components produced during the demodulation are shifted further in frequency with respect to the desired baseband modulation signal so that the integration of the FM demodulator is simplified, while a simple low-pass filter at the output of the FM demodulator is sufficient to realise an effective suppression of interference.

Another preferred embodiment of the invention, in which the same effect with respect to the limiter and the FM demodulator is obtained, is characterized in that the further FM demodulator comprises a limiter circuit which is connected to a first input and, via a filter circuit, to a second input of a multiplier circuit, and a sixth mixer stage preceding the limiter circuit for an up-conversion of the frequency of the signal applied to the limiter.

Yet another preferred embodiment of the invention, in which filtering is possible at a comparatively low frequency, is characterized in that at least one of the first-mentioned and further FM demodulators comprises a limiter circuit, a multiplier circuit having two inputs and an output and a filter circuit arranged between the further limiter circuit and one of the two inputs of the multiplier circuit, said filter circuit being arranged between a seventh and an eighth mixer stage for a down-conversion and an up-conversion, respectively, of the frequency of the input signal and the output signal of the filter circuit.

BRIEF DESCRIPTION OF THE DRAWINGS

These and other aspects of the invention will be apparent from and will be elucidated with reference to the embodiments described hereinafter. Corresponding elements are denoted by the same reference labels. In the drawings.

DESCRIPTION OF THE PREFERRED EMBODIMENTS

Figure 1:
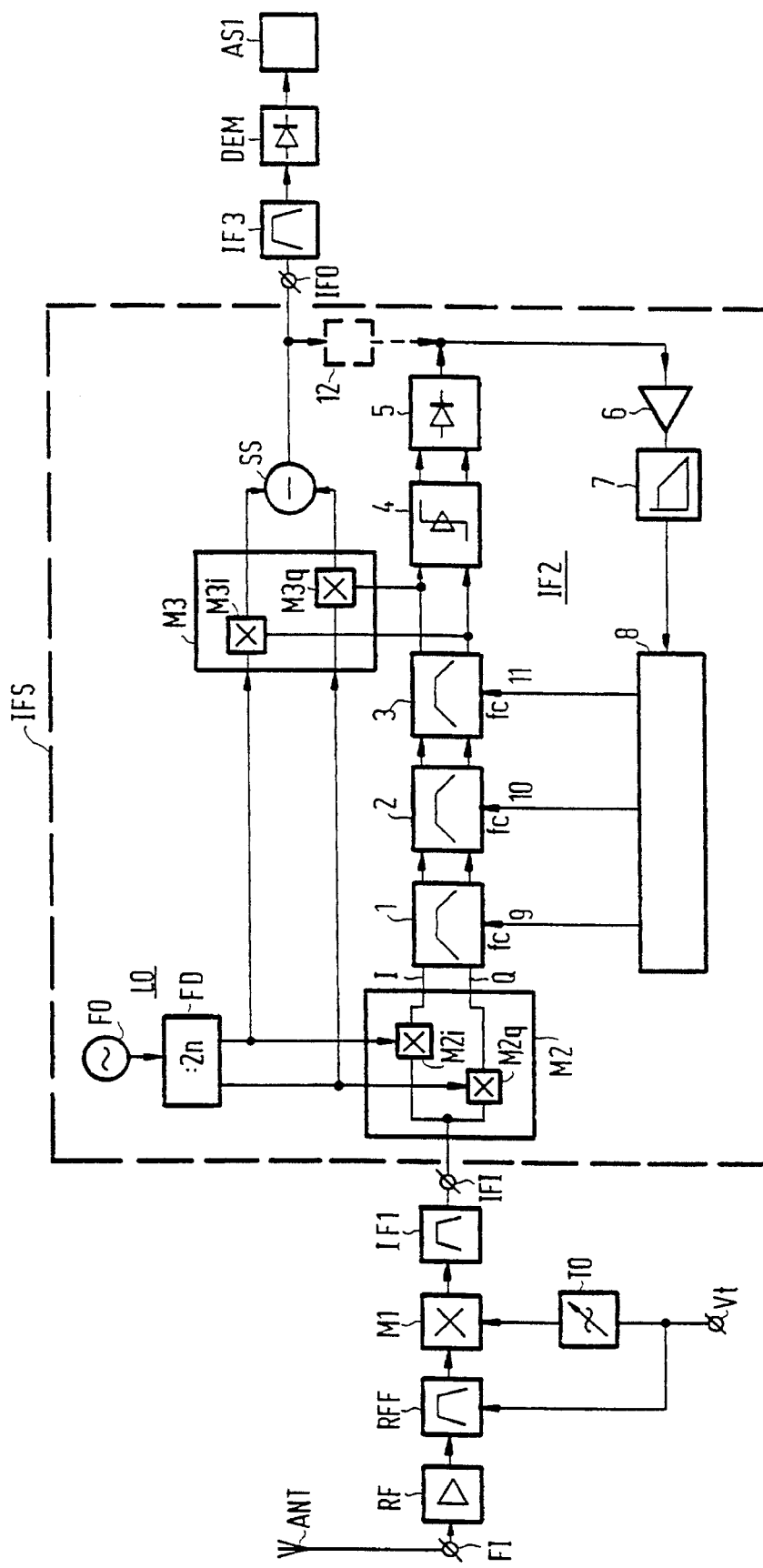
FIG. 1 shows a first embodiment of an FM receiver according to the invention.

FIG. 1 shows an FM receiver according to the invention having a radio frequency (RF) antenna input for connecting an antenna ANT thereto, to which input are successively coupled an RF input section RF and a tunable RF input filter RFF for RF amplification and selection of a desired RF FM reception signal, a first mixer stage M1 to which a tunable oscillation signal is applied from a tuning oscillator TO for a frequency conversion of the desired RF FM reception signal to a first intermediate frequency (IF) signal having a carrier frequency located on average at a first intermediate frequency f1, a first IF section IF1 for a first IF selection, a second IF stage IFS to be described hereinafter for a second IF selection, a third IF section IF3 for a third IF selection, a first FM demodulator DEM for demodulating the third IF signal selected by the third IF section IF3, a low-pass filter and audio signal processor ASP preceding a sound reproducing device (not shown) for a low-pass selection of the demodulated baseband modulation signal of said desired RF FM reception signal and for audio signal processing and reproduction, respectively.

A common tuning voltage is applied from a tuning control terminal Vt to tuning control inputs of the RFF and the tuning oscillator TO. Consequently, a tuning synchronism is obtained between the signal tuning on the one hand and the RFF on the other hand so that the RFF can be chosen to have a comparatively narrow band and hence an effective mirror suppression is obtained.

Except for the signal processing in the second IF stage IFS, the signal processing in the FM receiver described so far corresponds to that of a conventional superheterodyne FM receiver. For example, the first mixer stage M1 can realise a frequency conversion of an RF FM reception signal at an RF carrier frequency of the order of 100 MHz to a first intermediate frequency f1 of, for example, 10.7 MHz. In contrast to the IF signal processing in such conventional superheterodyne FM receivers, the first IF signal of the first IF section IF1 of the FM receiver according to the invention is applied via an input terminal IFI of the second IF stage IFS to a second mixer stage M2 arranged in the second IF stage IFS. The second mixer stage M2 realises a frequency conversion of the first IF signal to a second IF signal having a carrier frequency located on average at a second intermediate frequency f2.

The second intermediate frequency f2 can be chosen to be relatively low with respect to the first intermediate frequency f1 so that it will be possible to achieve a high selectivity at a sufficiently large dynamic range with a comparatively simple bandpass filter circuit as the second IF filter. A further improvement of the selectivity will be possible by giving such a bandpass filter circuit a tunable structure and by varying the tuning with the demodulated baseband modulation signal. To this end, for example, an output of the first FM demodulator DEM may be coupled (not shown) to a tuning control input of said bandpass filter circuit. To obtain a sufficient stability in the tuning control, the open loop gain of the tuning control loop which is coupled from the output of said bandpass filter circuit via the first FM demodulator DEM to the tuning control input of this bandpass filter circuit should be smaller than one. The tuning of the bandpass filter circuit thereby dynamically tracks the instantaneous frequency modulation of the second IF signal so that the bandwidth of the bandpass filter can be chosen to be considerably smaller than the bandwidth of the second IF signal.

In the embodiment shown a cascade circuit of three tunable resonance amplifiers 1–3 operating as bandpass filters has been chosen, which realise a tunable second IF filter of the second IF section IF2, each at a resonance frequency which tracks the instantaneous frequency modulation of the second IF signal and which is on average equal to the second intermediate frequency f2. To this end the output of said cascade circuit is fed back to tuning control inputs 9, 10 and 11 of the respective resonance amplifiers 1–3 via a limiter 4, a further, or second FM demodulator 5, a loop amplifier 6, a loop filter 7 and a tuning control signal generating circuit 8. The tuning control signal generating circuit 8 has three outputs which are coupled to tuning control inputs 9–11, respectively, of the resonance amplifiers 1–3. First, second and third tuning control loops are thereby formed. The open loop gain of each one of the first, second and third tuning control loops should be smaller than one so as to prevent instabilities in the loops. The elements 1–11 constitute a second IF section IF2 of the second IF stage IFS. The resonance amplifiers 1–3 can be easily integrated and provide a very high selectivity. They are known per se from European Patent Application EU 0 420 974 and do not need to be further described for understanding the invention. In order to render a low-distortion selection possible at the comparatively low value of f2, the resonance amplifiers 1–3 are used as polyphase filters of the phase-quadrature type. To this end a phase-splitting device for converting a single-phase signal into a pair of phase-quadrature signals is to be arranged in the IF signal path.

In the embodiment of FIG. 1, phase splitting is effected by way of example with the aid of the second mixer stage M2, which comprises in-phase and quadrature multiplier circuits M2$i$ and M2$q$ to which the first IF signal is applied from the first IF section IF1 jointly with in-phase and quadrature mixing signals from a local oscillator device LO. The local oscillator device LO comprises a fixed oscillator FO for supplying a fixed oscillator frequency flo, followed by a frequency division circuit FD. The frequency division circuit FD derives the last-mentioned in-phase and quadrature mixing signals from the oscillator frequency flo by dividing it by a division factor of 2n. Starting from the aforementioned numerical example with f1=10.7 MHz, the second intermediate frequency f2 will be 300 kHz at an flo of, for example, 22 MHz and a frequency division by two (n=1) in the frequency division circuit FD and hence in-phase and quadrature mixing signals at ½ flo=11 MHz.

The second mixer stage M2 not only provides a down-conversion, but also operates as a phase-splitting device in which in-phase and quadrature components I and Q of the second IF signal are obtained at f2 from the single-phase first intermediate frequency signal. As mentioned hereinbefore, this second phase-quadrature IF signal is filtered at a relatively high selectivity in the cascade circuit of the resonance amplifiers 1–3. Subsequently, the in-phase and quadrature components I and Q of the second IF signal are limited in amplitude in the limiter 4, followed by a demodulation in the second FM demodulator 5. This second FM demodulator 5 may be constructed in known manner and comprises, for example, a multiplier circuit (not shown) with a frequency-dependent phase shifter which is operative for one of the in-phase and quadrature components I and Q of the second IF signal. The baseband modulation signal is applied to the tuning control signal generating circuit 8 from the output of the second FM demodulator 5 via the loop amplifier 6 and the loop filter 7. The tuning control signal generating circuit 8 may have, for example, a junction point (not shown) via which the baseband modulation signal amplified in the loop amplifier 6 (possibly at a gain factor smaller than one) is applied in common to the tuning control inputs 9–11, or it may have a cascade arrangement of two amplifier circuits (not shown), which cascade arrangement has an input coupled to the tuning control terminal 9 and an output coupled to the tuning control terminal 11, the common junction point of the two amplifier circuits being connected to the tuning control terminal 10. The gain factors of these amplifier circuits are to be chosen in such a way that no instabilities are produced in the tuning control of the resonance amplifiers 1–3. This is achieved when the open loop gain of the tuning control loop of each one of these resonance amplifiers 1–3 is smaller than one. The tuning control does not require any further explanation for understanding the invention.

The output of the cascade circuit 1–3 is also coupled to an in-phase multiplier circuit M3$i$ and a quadrature multiplier circuit M3$q$ of a third mixer stage M3. The in-phase and quadrature mixing signals of the local oscillator device LO at to are also applied to the in-phase multiplier circuit M3$i$ and quadrature multiplier circuit M3$q$. The in-phase multiplier circuit M3$i$ and quadrature multiplier circuit M3$q$ of the third mixer stage M3 consequently supply in-phase and quadrature components of a third IF signal at a carrier frequency which is located on average at a third intermediate frequency f3 which is above the second intermediate frequency f2 and is equal to the first intermediate frequency f1 due to the common use of the local oscillator device LO. Outputs of the in-phase multiplier circuit M3$i$ and the quadrature multiplier circuit M3$q$ are coupled to inputs of a superposition stage SS which realises a superposition of the mixing products obtained in the in-phase multiplier circuit M3$i$ and quadrature multiplier circuit M3$q$ such that the mixing products occurring at f3 are mutually added to each other and the unwanted mixing products which are mirrored with respect to to compensate each other. The third IF signal thus obtained will become available at an output terminal IFO of the second IF stage IFS.

The third IF signal with f3=f1 is applied via the output terminal IFO of the second IF stage IFS to, successively, the third IF section IF3, the first FM alemodulator DEM, the low-pass filter and the audio signal processor ASP and the sound reproducing device (not shown) in which, as mentioned hereinbefore, a third IF selection, a demodulation, a low-pass filtering, an audio signal processing and reproduction, respectively, take place in known manner.

The input and output signals of the second IF stage IFS at IFI and IFO are at one and the same intermediate frequency, at 10.7 MHz in the given case. The second IF stage IFS can therefore be easily implemented as a component in existing conventional superheterodyne FM receivers, resulting in an FM receiver according to the invention having a comparatively high IF selectivity. Moreover, due to the use of resonance amplifiers as phase-quadrature filters, the second intermediate frequency f2 can be chosen to be considerably lower than the second intermediate frequency of 700 kHz of the first-mentioned known FM receiver. In a practical embodiment of the FM receiver according to the invention the second intermediate frequency f2 was 300 kHz. Due to this low second intermediate frequency t2 the requirement with respect to the quality factor Q of the second IF stage IFS, which determines the dynamic range, is further decreased, which further simplifies the integration of this second IF stage IFS. Since the second IF stage IFS supplies a third IF signal which is relatively high in frequency to the FM demodulator DEM, the interference components produced during the demodulation are comparatively far remote from the baseband modulation signal and can be effectively suppressed by means of an easily integrable low-pass filter.

Figure 2:
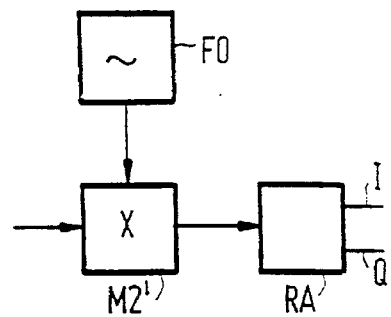
FIG. 2 shows a second mixer stage operating as a phase-splitting device for use in an FM receiver according to the invention.

Another manner of down-conversion and phase splitting is shown in FIG. 2. In this Figure a frequency conversion is effected in a multiplier M2' and a conversion from single phase to phase quadrature is effected in a resonance amplifier RA coupled to an output of the multiplier M2'. A fixed local oscillator frequency of 11 MHz in the given case is applied from the fixed oscillator OF to the multiplier M2'. The resonance amplifier RA supplies in-phase and quadrature components of the second IF signal at the second intermediate frequency f2 from in-phase (I) and quadrature (Q) outputs.

An alternative manner of tuning control is obtained by omitting the limiter 4 and the second FM demodulator and by using instead a third FM demodulator 12 which is shown in broken lines. The input of the third FM demodulator 12 is connected to an output of the superposition stage SS, while an output is connected to the loop amplifier 6. In this third FM demodulator 12 the third IF signal is demodulated so that, likewise as with the first FM demodulator DEM, the higher-order interference components produced during demodulation are comparatively far removed from the desired baseband modulation signal and can be suppressed by means of a simple integrable low-pass filter.

It is further possible to implement the limiter 4 and the second FM demodulator in single phase by utilizing, for example, only the in-phase or the quadrature component of the second IF signal selected by the resonance amplifiers 1–3. In such an application it is possible to utilize the inventive idea—filtering at a relatively low frequency and demodulation at a relatively high frequency—in a wider sense, for example, as is shown by means of the FM demodulators in FIGS. 3 and 4. These may be used instead of the limiter 4 and the second FM demodulator 5.

Figure 3:
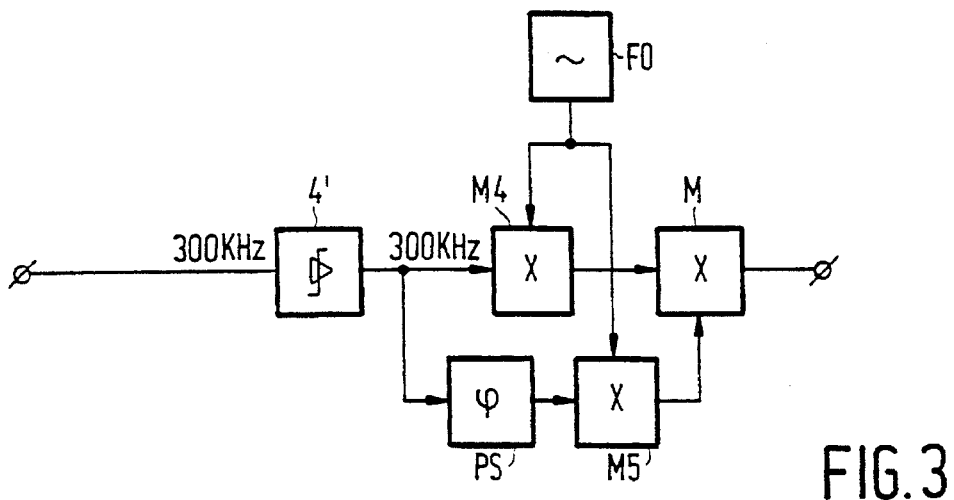
FIG. 3 shows a first embodiment of an FM demodulator for use in an FM receiver according to the invention.

FIG. 3 shows a first embodiment of an FM demodulator for use in an FM receiver according to the invention, comprising a limiter 4' to which, for example, the in-phase component of the second IF signal selected by the resonance amplifiers 1–3 is applied. The limiter 4' is connected via a fourth mixer stage M4 to a first input of a multiplier circuit and via a filter circuit PS, operating as a frequency-dependent phase shifter, followed by a fifth mixer stage M5, to a second input of the multiplier circuit M. The fourth and fifth mixer stages M4 and M5 receive mutually equal mixing signals for an up-conversion of the frequency of the two input signals of the multiplier circuit M. The two mixing signals for the fourth mixer stage M4 and the fifth mixer stage M5 are supplied from the fixed oscillator FO and have a frequency which is, for example, equal to 11 MHz. In contrast to the original second FM demodulator 5, a frequency demodulation at f3, i.e. a much higher frequency than f2 is effected in the multiplier circuit M in FIG. 3.

Figure 4:
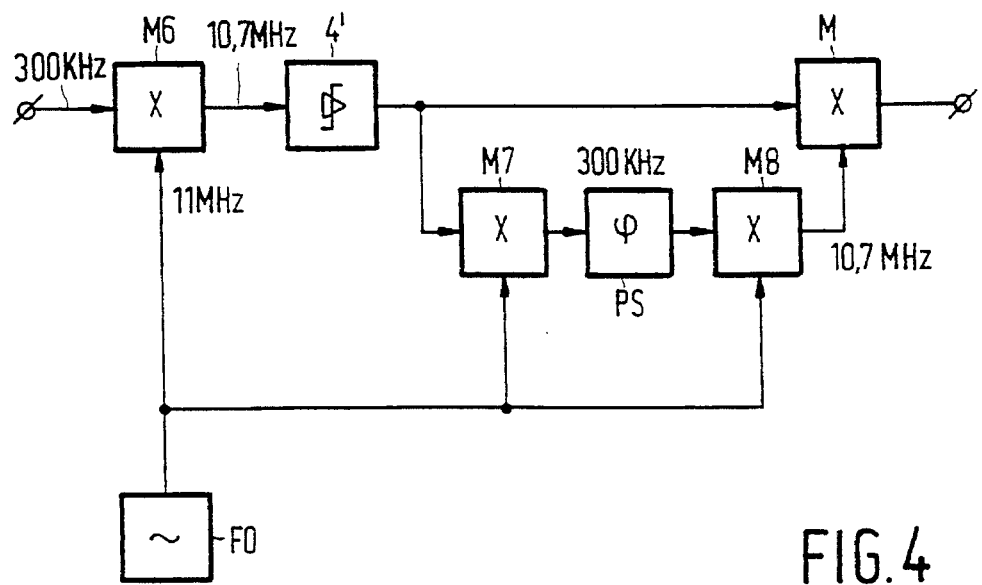
FIG. 4 shows a second embodiment of an FM demodulator for use in an FM receiver according to the invention.

FIG. 4 shows a second embodiment of an FM demodulator for use in an FM receiver according to the invention, using a sixth mixer stage M6 to which, for example, the in-phase component of the second IF signal selected by the resonance amplifiers 1–3 is applied and which precedes the limiter circuit 4'. An 11 MHz mixing signal is applied to the sixth mixer stage M6 from the local oscillator device FO for an up-conversion of the frequency of the signal applied to the limiter, so that higher-order interference components can be suppressed with a simple filter downstream of the multiplier circuit M. The filter circuit PS arranged between the limiter circuit 4' and one of the two inputs of the multiplier circuit M is arranged between a seventh and an eighth mixer stage M7 and M8 for a down-conversion and an up-conversion of the frequency of the input signal and the output signal, respectively, of the filter circuit. Said 11 MHz mixing signal is applied also from the local oscillator device FO to the seventh mixer stage M7 and the eighth mixer stage M8. Consequently, filtering takes place at the comparatively low frequency f2, while demodulation takes place at the comparatively high frequency f3.

It will be evident that the invention is not limited to the embodiment shown in FIG. 1. For example, it is possible to use the inventive idea for a single or multistage and/or single-phase bandpass filter for selection in the second IF section with filter types other than resonance amplifiers, to arrange the loop filter 7 in the signal direction in the tuning control loop for the loop amplifier 6 or to omit it completely and/or even completely refrain from the dynamic frequency tracking of the resonance amplifiers 1–3. In the latter case the bandwidth should be chosen to be sufficiently large to comprise the bandwidth of the second IF signal. It is also possible to omit the third IF section IF3 and/or to render the FM demodulators shown in FIGS. 3 and 4 suitable, after some adaptation, for use as the said first, second and/or third FM demodulator, DEM, 5 and 12, respectively. If less stringent requirements are imposed on the exchangeability of the second IF stage IFS, the output signal of the first FM demodulator may be used to vary the tuning of the bandpass filter in the second IF stage IFS via a suitably chosen amplification. It is then also possible to choose the third intermediate frequency f3 to be higher than the second intermediate frequency f2, but unequal to the first intermediate frequency f1.

We claim:

1. An FM receiver comprising; an RF section, a first mixer stage for converting a desired RF reception signal into a first IF signal having a carrier frequency located on average at a first intermediate frequency, a first IF section for selecting the first IF signal, a second mixer stage having a fixed frequency oscillator coupled to the second mixer stage for fixedly converting the first IF signal to a second IF signal having a carrier frequency located on average at a second intermediate frequency below the first intermediate frequency and such that the frequency difference between the first IF signal and the second IF signal is substantially constant, a second IF section for selecting the second IF signal, said second IF section being coupled to an FM demodulator for demodulating the baseband modulation signal of said desired RF reception signal and followed by a low-pass filter for selecting the baseband modulation signal, and a third mixer stage having a fixed frequency oscillator coupled to the third mixer stage, wherein the third mixer stage is coupled between the second IF section and the FM demodulator for fixedly converting the second IF signal to a third IF signal having a carrier frequency located on average at a third intermediate frequency above the second intermediate frequency and such that the frequency difference between the second and third intermediate frequencies is substantially constant.

2. An FM receiver as claimed in claim 1, wherein said FM demodulator is coupled to said third mixer stage so that the FM demodulator receives said third IF signal as its input signal thereby to increase the frequency separation between a desired baseband modulation signal and higher order frequency interference components produced during frequency demodulation, and the third intermediate frequency is equal to the first intermediate frequency, and further comprising means for applying mutually equal second and third constant frequency mixing signals to the second and third mixer stages, respectively.

3. An FM receiver comprising; an RF section, a first mixer stage for converting a desired RF reception signal into a first IF signal having a carrier frequency located on average at a first intermediate frequency, a first IF section for selecting the first IF signal, a second mixer stage for converting the first IF signal to a second IF signal having a carrier frequency located on average at a second intermediate frequency, said second intermediate frequency being located below the first intermediate frequency, a second IF section for selecting the second IF signal, said second IF section being coupled to an FM demodulator for demodulating the baseband modulation signal of said desired RF reception signal and followed by a low-pass filter for selecting the baseband modulation signal, a third mixer stage coupled between the second IF section and the FM demodulator for converting the second IF signal to a third IF signal having a carrier frequency located on average at a third intermediate frequency, wherein said third intermediate frequency is above the second intermediate frequency and is equal to the first intermediate frequency, means for applying mutually equal second and third mixing signals to the second and third mixer stages, respectively, and a phase-splitting device for converting a single-phase signal into a pair of phase-quadrature signals and a resonance amplifier operating as a tunable phase-quadrature IF filter, wherein the resonance amplifier applies in-phase and quadrature components of the second IF signal from in-phase and quadrature outputs to said third mixer stage, said third mixer stage comprising in-phase and quadrature multiplier circuits and a superposition stage for converting the in-phase and quadrature components of the second IF signal to in-phase and quadrature components of the third IF signal and for mutually superpositioning the two last-mentioned in-phase and quadrature components for converting the third intermediate frequency from phase quadrature to single phase.

4. An FM receiver as claimed in claim 3, wherein the resonance amplifier also operates as a phase-splitting device and has in-phase and quadrature inputs which are mutually coupled in common to an output of the second mixer stage.

5. An FM receiver as claimed in claim 3, wherein the second mixer stage also operates as the phase-splitting device and comprises in-phase and quadrature multiplier circuits, signal inputs of which are coupled in common to an output of the first IF section, mixing signal inputs are coupled to in-phase and quadrature outputs of a fixed local phase-quadrature oscillator, and signal outputs of said multiplier circuit are coupled to in-phase and quadrature inputs of the resonance amplifier, said in-phase and quadrature outputs of the fixed local phase-quadrature oscillator also being coupled to respective mixing signal inputs of the in-phase and quadrature multiplier circuits of the third mixer stage.

6. An FM receiver as claimed in claim 1 wherein the second IF section comprises a tunable IF filter having a tuning control input to which the baseband modulation signal of said desired RF reception signal is applied for a dynamic frequency tracking of the tuning of the tunable IF filter by means of the baseband modulation signal.

7. An FM receiver as claimed in claim 6, wherein the tunable IF filter in the second IF section precedes a further FM demodulator which is connected in a tuning control loop from the output of the tunable IF filter to the tuning control input, thereof said tuning control loop having an open loop gain which is less than one.

8. An FM receiver as claimed in claim 7, wherein the further FM demodulator comprises a limiter circuit which is connected to a first input and, via a filter circuit, to a second input of a multiplier circuit, and a further mixer stage preceding the limiter circuit for an up-conversion of the frequency of a signal applied to the limiter circuit.

9. An FM receiver as claimed in claim 1 further comprising a phase-splitting device for convening a single-phase signal into a pair of phase-quadrature signals and a resonance amplifier operating as a tunable phase-quadrature IF filter, wherein the resonance amplifier applies in-phase and quadrature components of the second IF signal from in-phase and quadrature outputs to said third mixer stage, said third mixer stage comprising in-phase and quadrature multiplier circuits and a superposition stage for converting the in-phase and quadrature components of the second IF signal to in-phase and quadrature components of the third IF signal and for mutually superpositioning the two last-mentioned in-phase and quadrature components for convening the third intermediate frequency from phase quadrature to single phase.

10. An FM receiver as claimed in claim 9, wherein the resonance amplifier also operates as a phase-splitting device and has in-phase and quadrature inputs which are mutually coupled in common to an output of the second mixer stage.

11. An FM receiver as claimed in claim 9, wherein the second mixer stage also operates as the phase-splitting device and comprises in-phase and quadrature multiplier circuits, signal inputs of which are coupled in common to an output of the first IF section, mixing signal inputs are coupled to in-phase and quadrature outputs of a fixed local phase-quadrature oscillator, and signal outputs of said multiplier circuits are coupled to in-phase and quadrature inputs of the resonance amplifier, said in-phase and quadrature outputs of the fixed local phase-quadrature oscillator also being coupled to respective mixing signal inputs of the in-phase and quadrature multiplier circuits of the third mixer stage.

12. An FM receiver as claimed in claim 3 wherein the second IF section comprises a tunable IF filter having a tuning control input to which the baseband modulation signal of said desired RF reception signal is applied for a dynamic frequency tracking of the tuning of the tunable IF filter by means of the baseband modulation signal.

13. An FM receiver as claimed in claim 12, wherein that the tunable IF filter in the second IF section precedes a further FM demodulator which is connected in a tuning control loop from the output of the tunable IF filter to the tuning control input thereof, said tuning control loop having an open loop gain which is less than one.

14. An FM receiver as claimed in claim 13, wherein the further FM demodulator comprises a limiter circuit which is connected via a fourth mixer stage to a first input of a multiplier circuit and via a filter circuit, followed by a fifth mixer stage, to a second input of the multiplier circuit, mutually equal mixing signals being applied to said fourth and fifth mixer stages for an up-conversion of the frequency of the input signals of the multiplier circuit.

15. An FM receiver as claimed in claim 13, wherein the further FM demodulator comprises a limiter circuit which is connected to a first input and, via a filter circuit, to a second input of a multiplier circuit, and a sixth mixer stage preceding the limiter circuit for an up-conversion of the frequency of a signal applied to the limiter circuit.

16. An FM receiver as claimed in claim 13, wherein at least one of the FM demodulators comprises; a limiter circuit, a multiplier circuit having two inputs and an output, a filter circuit coupled between the limiter circuit and wherein and one of the two inputs of the multiplier circuit, said filter circuit is coupled between a seventh and an eighth mixer stage for a down-conversion and an up-conversion, respectively, of the frequency of the input signal and the output signal of the filter circuit.

17. An IF stage for use in an FM receiver as claimed in claim 1, comprising: an IF input terminal for applying the first IF signal thereto, to which are successively coupled the second mixer stage, the second IF section with a second IF filter and the third mixer stage, said third mixer stage being coupled to an IF output terminal of the IF stage, and means for applying second and third mixing signals of the same frequency to said second and third mixer stages from a common fixed local oscillator so that the second intermediate frequency is the difference frequency of the first intermediate frequency and the frequency of the second mixing signal.

18. An IF stage as claimed in claim 17, wherein the second IF filter is tunable and precedes a further FM demodulator which is connected in a tuning control loop from an output of the tunable IF filter to a tuning control input thereof, said tuning control loop having an open loop gain which is less than one.

19. The FM receiver as claimed in claim 1 further comprising, means for applying to the second and third mixer stages second and third mixing signals, respectively, that are independent of the first IF signal, wherein the first IF section, the second mixer stage, the second IF section, the third mixer stage and the FM demodulator are coupled together in cascade to form a single signal channel for said first, second and third IF signals and the FM demodulator receives said third IF signal as its input signal.

20. The FM receiver as claimed in claim 1 wherein the fixed frequency oscillator is coupled to the second mixer stage so that a complete second IF signal of said second intermediate frequency passes through the second IF section.

21. An IF stage for an FM receiver which derives a first IF signal having a carrier frequency on average of a first intermediate frequency, said IF stage comprising:

an IF input terminal for receipt of said first IF signal, an IF output terminal for the IF stage, a mixer circuit having a first input means coupled to said IF input terminal, a second input means and an output means, an IF section including an IF filter, input means coupled to the mixer circuit output means, and output means, a further mixer circuit having first input means coupled to said output means of said IF section and output means coupled to said IF output terminal, and a fixed frequency oscillator coupled to the second input means of the mixer circuit and to a second input means of the further mixer circuit to apply fixed mixing signals thereto such that the mixer circuit derives a second IF signal having a carrier frequency on average of a second intermediate frequency which is lower than said first intermediate frequency and the further mixer circuit derives a third IF signal having a carrier frequency on average of a third intermediate frequency which is higher than said second intermediate frequency.

22. The IF stage as claimed in claim 21, wherein said IF filter is tunable and the output means of the IF section is coupled to an FM demodulator connected in a tuning control loop between said IF section output means and a tuning control input of the tunable IF filter, said tuning control loop having an open loop gain less than one.

23. The IF stage as claimed in claim 22, wherein said tunable IF filter includes a resonance amplifier, wherein the tuning control loop includes a limiter circuit coupled in cascade with the resonance amplifier and the FM demodulator, and wherein said oscillator applies mixing signals of the same frequency to the second input means of the mixer circuit and the further mixer circuit whereby said first intermediate frequency is equal to said third intermediate frequency.

24. The IF stage as claimed in claim 21, further comprising:

a phase splitting device for converting said first IF signal, which is a single phase signal, into a first in-phase signal and a second quadrature signal, wherein said further mixer circuit comprises an in-phase multiplier circuit and a quadrature multiplier circuit coupled to said first and second input means of the further mixer circuit for deriving said third IF signal with in-phase and quadrature signal components, and a signal combining circuit coupled to said in-phase and quadrature multiplier circuits for combining said in-phase and quadrature components of the second IF signal so as to convert the third IF signal in-phase and quadrature signal components into a single phase third IF signal.

* * * * *